United States Patent
Barbulescu et al.

(10) Patent No.: US 9,413,323 B2
(45) Date of Patent: Aug. 9, 2016

(54) SYSTEM AND METHOD OF FILTERING AN AUDIO SIGNAL PRIOR TO CONVERSION TO AN MU-LAW FORMAT

(71) Applicant: Alpine Audio Now, LLC, Reston, VA (US)

(72) Inventors: Marcel Barbulescu, Falls Church, VA (US); Elan Joel Blutinger, Washington, DC (US); Radu Robotin, Arlington, VA (US)

(73) Assignee: Alpine Audio Now, LLC., Reston, VA (US)

( * ) Notice: Subject to any disclaimer, the term of this patent is extended or adjusted under 35 U.S.C. 154(b) by 0 days.

(21) Appl. No.: 14/174,259

(22) Filed: Feb. 6, 2014

(65) Prior Publication Data

US 2014/0219476 A1    Aug. 7, 2014

Related U.S. Application Data

(60) Provisional application No. 61/761,518, filed on Feb. 6, 2013.

(51) Int. Cl.
*H03G 5/00*    (2006.01)
*H03G 9/02*    (2006.01)
*H03G 7/00*    (2006.01)
*H03G 3/00*    (2006.01)
*H03G 5/16*    (2006.01)

(52) U.S. Cl.
CPC ............. *H03G 9/025* (2013.01); *H03G 3/001* (2013.01); *H03G 5/165* (2013.01); *H03G 7/002* (2013.01)

(58) Field of Classification Search
None
See application file for complete search history.

(56) References Cited

U.S. PATENT DOCUMENTS

| | | | |
|---|---|---|---|
| 6,813,352 B1 * | 11/2004 | Duttweiler | 379/406.08 |
| 2001/0034219 A1 | 10/2001 | Hewitt et al. | |
| 2005/0123152 A1 * | 6/2005 | Magrath | 381/104 |
| 2008/0144861 A1 * | 6/2008 | Melanson et al. | 381/120 |
| 2008/0214162 A1 | 9/2008 | Ramer et al. | |

OTHER PUBLICATIONS

U.S. Appl. No. 14/168,708, Barbulescu et al., filed Jan. 30, 2014.

* cited by examiner

*Primary Examiner* — Muhammad N Edun

(57) ABSTRACT

Disclosed is a method of processing a signal such as an audio signal. The method includes normalizing a received signal to a level of between −2 dB and −10 dB to yield a normalized signal, compressing the normalized signal exceeding a threshold (such as 70% of the maximum volume and above) to yield a compressed signal, performing frequency equalization on the compressed signal to yield an equalized signal; and normalizing the equalized signal.

14 Claims, 2 Drawing Sheets

SYSTEM AND METHOD OF FILTERING AN AUDIO SIGNAL PRIOR TO CONVERSION TO AN MU-LAW FORMAT

PRIORITY CLAIM

This application claims priority to U.S. Provisional Patent Application No. 61/761,518 filed on Feb. 6, 2013, which is herein incorporated by reference in its entirety.

RELATED APPLICATION

This application is related to U.S. patent application Ser. No. 14/168,708 filed on Jan. 30, 2014. The content of the application is incorporated herein by reference in its entirety.

BACKGROUND OF THE INVENTION

Field of the Invention

The present invention relates to audio signals and more particularly to a system and method of filtering an audio signal prior to its conversion to an MU-LAW format.

SUMMARY

Additional features and advantages of the invention will be set forth in the description which follows, and in part will be obvious from the description, or may be learned by practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth herein.

Disclosed are systems, methods and computer-readable devices for processing a signal such as an audio signal. The method includes normalizing a received signal to a level of between −2 dB and −10 dB to yield a normalized signal, reducing the dynamic range of the normalized signal by compressing the peaks exceeding a certain volume threshold (such as 70% of the maximum volume and above, or any value such as between 50% and 95%) and a volume range (such as 50% to 95% of the maximum volume) to yield a compressed signal, performing frequency equalization on the compressed signal to yield an equalized signal; and normalizing the equalized signal. The normalized and equalized signal can then be converted into the MU-LAW format.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only exemplary embodiments of the invention and are not therefore to be considered to be limiting of its scope, the invention will be described and explained with additional specificity and detail through the use of the accompanying drawings in which.

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

The present disclosure discloses a process for processing a signal prior to its conversion through a companding algorithm such as the u-jaw or mu-law algorithm. This is an algorithm that reduces the dynamic range of an audio signal and increases the signal to noise ratio at the expense of reduced bandwidth. In digital signals, the u-law algorithm and similar algorithms will reduce the quantization error. Different versions of a companding algorithm can be used such as a continuous or discrete version. The companding algorithm can be implemented using an analog version, a non-linear ADC version or a digital version. The known A-law algorithm could also be used as the companding algorithm. The primary disclosure herein covers preprocessing prior to applying the companding algorithm. The result of the signal being preprocessed is an enhanced and improved affect with respect to both the signal to noise ratio (SNR) and the quantization error when the signal is converted via the companding algorithm. We will first turn to FIG. 1 and a general system embodiment and then step through the processing operations according to an embodiment of this disclosure.

Figure 1:
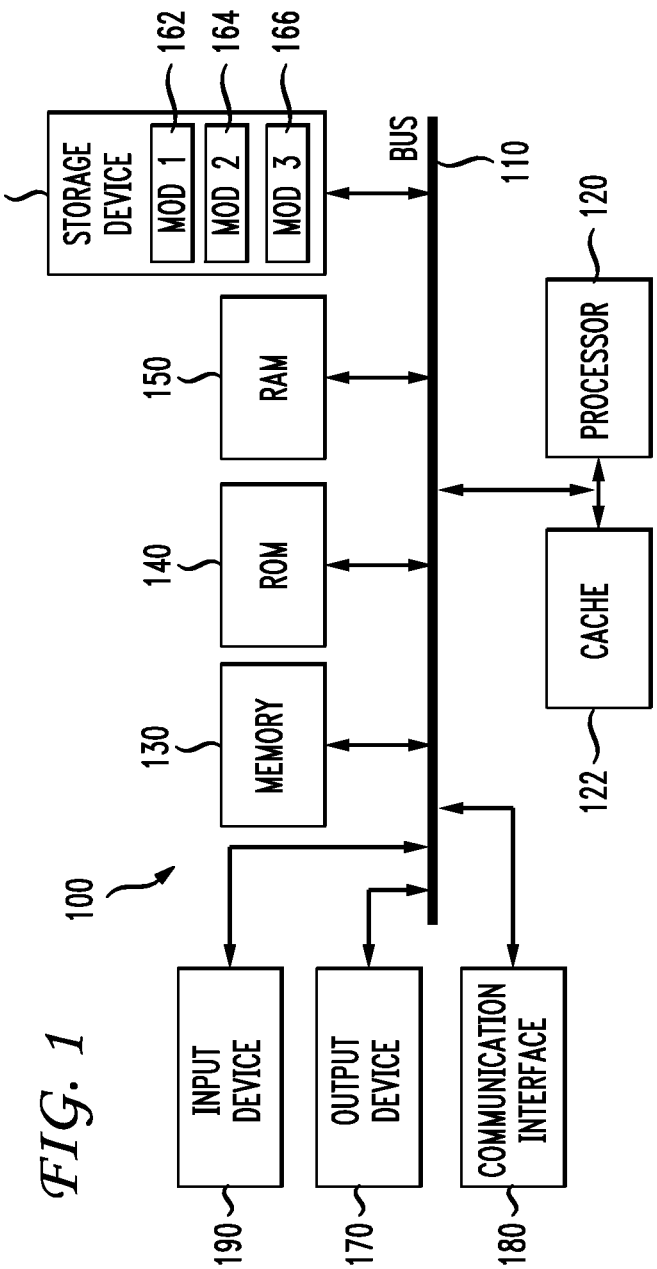
FIG. 1 illustrates an example system embodiment.

With reference to FIG. 1, an exemplary system includes a general-purpose computing device 100 including a processing unit (CPU) 120 and a system bus 110 that couples various system components including the system memory such as read only memory (ROM) 140 and random access memory (RAM) 150 to the processing unit 120. Other system memory 130 may be available for use as well. It can be appreciated that the invention may operate on a computing device with more than one CPU 120 or on a group or cluster of computing devices networked together to provide greater processing capability. The system bus 110 may be any of several types of bus structures including a memory bus or memory controller, a peripheral bus, and a local bus using any of a variety of bus architectures. A basic input/output (BIOS) stored in ROM 140 or the like, may provide the basic routine that helps to transfer information between elements within the computing device 100, such as during start-up. The computing device 100 further includes storage devices such as a hard disk drive 160, a magnetic disk drive, an optical disk drive, tape drive or the like. The storage device 160 is connected to the system bus 110 by a drive interface. The drives and the associated computer readable media provide nonvolatile storage of computer readable instructions, data structures, program modules and other data for the computing device 100. The basic components are known to those of skill in the art and appropriate variations are contemplated depending on the type of device, such as whether the device is a small, handheld computing device, a desktop computer, or a computer server.

Although the exemplary environment described herein employs the hard disk, it should be appreciated by those skilled in the art that other types of computer readable media which can store data that are accessible by a computer, such as magnetic cassettes, flash memory cards, digital versatile disks, cartridges, random access memories (RAMs), read only memory (ROM), a cable or wireless signal containing a bit stream and the like, may also be used in the exemplary operating environment.

To enable user interaction with the computing device 100, an input device 190 represents any number of input mechanisms, such as a microphone for speech, a touch-sensitive screen for gesture or graphical input, keyboard, mouse, motion input, speech and so forth. The input may be used by the presenter to indicate the beginning of a speech search query. The device output 170 can also be one or more of a number of output mechanisms known to those of skill in the art. In some instances, multimodal systems enable a user to provide multiple types of input to communicate with the computing device 100. The communications interface 180 generally governs and manages the user input and system output. There is no restriction on the invention operating on any particular hardware arrangement and therefore the basic features here may easily be substituted for improved hardware or firmware arrangements as they are developed.

For clarity of explanation, the illustrative system embodiment is presented as comprising individual functional blocks (including functional blocks labeled as a "processor"). The functions these blocks represent may be provided through the use of either shared or dedicated hardware, including, but not limited to, hardware capable of executing software. For example the functions of one or more processors presented in FIG. 1 may be provided by a single shared processor or multiple processors. (Use of the term "processor" should not be construed to refer exclusively to hardware capable of executing software.) Illustrative embodiments may comprise microprocessor and/or digital signal processor (DSP) hardware, read-only memory (ROM) for storing software performing the operations discussed below, and random access memory (RAM) for storing results. Very large scale integration (VLSI) hardware embodiments, as well as custom VLSI circuitry in combination with a general purpose DSP circuit, may also be provided.

Figure 2:
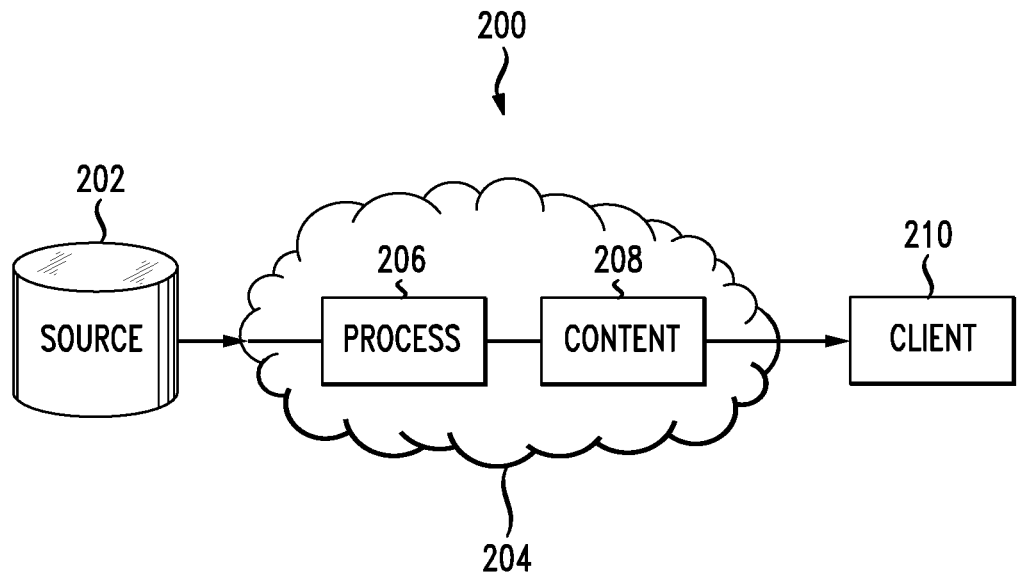
FIG. 2 illustrates another system embodiment.

The procedure of filtering the audio signal prior to their conversion to mu-Law format is disclosed. FIG. 2 illustrates an example arrangement 200 including a signal source 202 such as a website that streams audio or a server that streams data to an application or a client device 210. A network 204, such as the Internet, a telecommunications network, or other type of network, receives the signal and performs the preprocessing disclosed herein 206, prior to conversion using a companding algorithm 208. The signal is then further transmitted through the network 204 to the client device 210.

Figure 3:
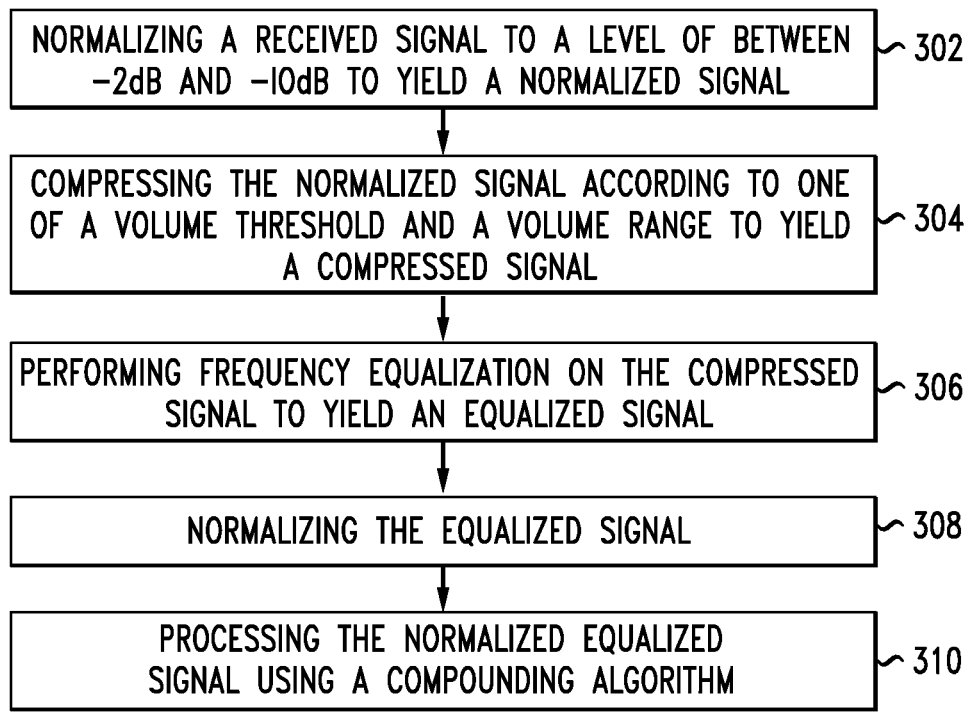
FIG. 3 illustrates an example method embodiment of the disclosure.

FIG. 3 illustrates an example method embodiment. The procedure assumes the initial audio format is 16 bit PCM mono. If the audio contains a stereo image (left and right tracks), a pre-processing stage of splitting to mono can be performed. The signal conditioning aims to reduce the harmonic distortions caused by hard clipping and limiting as of conversion to a companding format such as the mu-law or u-law format and reduced bit-depth. Such a result is achieved by a signal chain that performs compression and then frequency equalization. The compression helps reducing the dynamic range of the signal to a level that will not generate hard-clipping while the frequency equalization shapes the signal to be better fitted to a limited bandwidth (0-4 KHz) and also reduces the signal energy in certain frequency bands that are susceptible to generate distortion (i.e. low frequencies or the lower mid frequencies).

The first step is signal normalization to a predetermined level such as the level of −6 dB (302). The −6 dB level does not have to be exact and any other range such as −2 dB to −10 dB can be used. At this step, any DC offset has to be removed to prevent possible asynchronous clipping. The overall gain of the audio signal is adjusted so that the maximum peak level does not exceed −6 dB or some other chosen threshold.

The second processing step is compression (304) in a manner related to volume. Compressing the normalized signal reduces the dynamic range of the signal by using different gain factors for soft parts and for the more loud parts and alleviates the hard-clipping produced by the companding. The signal tracking is peak based (as opposed to root-mean-square (RMS) compression), the threshold level (thc) is set to 70% (or some other level such as between the range of 50-95%) of the maximum signal amplitude. The parameter level of course is adjustable and can be above or below 70%. Everything above the level or within the chosen range is compressed to a ratio (cr). One example compression ratio is 3:1. Other rations between 1:1 and 6:1 can also be used. The signal samples exceeding the threshold value (thc) receive a gain proportional with the inverse of the compression ratio. Everything below the threshold or outside of the range passes the compressor virtually unaffected. As a result, the loud passages have their volume reduced while the soft passages in the audio will be unaffected. The attack time of the compressor is short (around 50 ms) while the release time is longer, (1 s, for example). In each case, it is contemplated that other ranges beside the exemplary specific values are possible.

The third processing step is frequency equalization (306). The aim of this process is to compensate for the frequency response of the telephony or audio system: increase sensitivity in the lows, flat midrange and diminished highs. In addition, as a result of conversion to 8 KBps required by the mu-Law conversion, all frequencies above 4 KHz are lost. The equalization can include application of filters applied on one or more frequency bands. The following are examples of various filters that could be applied in any combination: (1) a low shelf filter removes the frequencies below 40 Hz with a level of −12 dB (adjustable, ls), (2) a band filter with the level −6 dB (adjustable, lc) and a center frequency of 125 Hz with a Q factor of 1 octave. The low-mid frequencies are shaped with a band filter having a level of −4 dB (adjustable, lm) and a center frequency at 500 Hz. The mid frequency filter has a width of 2 octaves, centered at 1 KHz, with a level of −3 dB (adjustable, mid) while the mid-high and high frequencies are shaped with two filters at 2 KHz and 4 KHz, respectively, having a width of 1 octave (Q=1) and a level of −4 dB (adjustable, mh and hi).

The next step is normalization to a predetermined level, such as a level of −6 dB (308), to make-up for the losses introduced by the compression and the equalization stages. These levels can be within a broader range as well such as −2 dB to −8 dB. Finally, the signal is converted using a companding algorithm (310) for transmission through a network.

The parameters mentioned above can be summarized as follows: Compression threshold level (default value 70%, minimum value 0%, maximum value 100%)—thc; Compression ratio (default value 3:1, minimum value 1:1, maximum value 30:1)—cr; Low shelf level (default value −12 dB, maximum value +30 dB, minimum value −30 dB)—ls; Low frequency cut (default value −6 dB, maximum value +30 dB, minimum value −30 dB)—lc; Low-mid frequency cut (default value −4 dB, maximum value +30 dB, minimum value −30 dB)—lm; Mid frequency cut (default value −3 dB, maximum value +30 dB, minimum value −30 dB)—mid; Mid-high frequency cut (default value −4 dB, maximum value +30 dB, minimum value −30 dB)—mh; High frequency cut (default value −4 dB, maximum value +30 dB, minimum value −30 dB)—hi. All of these ranges and levels are approximate and can vary in either direction 30-50%.

Another embodiment includes the signal itself whether stored in a computer-readable storage memory device or medium. For example, after all the processing set forth above, a signal results that has been normalized to a level of between −2 dB and −10 dB to yield a normalized signal. The normalized signal exceeding a threshold set at 70% of the peak volume signal has been compressed to yield a compressed signal that has been filtered through at least one filter for frequency equalization to yield an equalized signal that is again normalized. The compression can also be done according to one of a volume threshold and a volume range. The embodiment can relate to the signal at this stage of processing or the resulting signal after processing using the companding or u-law algorithm.

Embodiments within the scope of the present invention may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those of skill in the art will appreciate that other embodiments of the invention may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Although the above description may contain specific details, they should not be construed as limiting the claims in any way. Other configurations of the described embodiments of the invention are part of the scope of this invention.

Accordingly, the appended claims and their legal equivalents should only define the invention, rather than any specific examples given.

We claim:

1. A method comprising:
    normalizating a received signal to a level of between −2 dB and −10 dB to yield a normalized signal;
    compressing the normalized signal exceeding a threshold set at 70% of a peak volume to yield a compressed signal;
    performing frequency equalization on the compressed signal to yield an equalized signal; and
    normalizing the equalized signal.

2. The method of claim 1, wherein the level is −6 dB.

3. The method of claim 1, further comprising removing a DC offset.

4. The method of claim 1, wherein the volume threshold is related to a percentage of maximum signal amplitude.

5. The method of claim 4, wherein the percentage is approximately 70%.

6. The method of claim 1, wherein the compressing compresses the normalized signal by a ratio of 3:1.

7. The method of claim 1, wherein performing frequency equalization comprises applying a plurality of filters.

8. The method of claim 7, further comprising applying a low frequency filter to remove frequencies below 40 Hz, a band-pass filter having a level of −6 dB and a center frequency of 135 Hz, a low-mid band-pass filter having a level of −4 dB and a center frequency of 500 Hz, a mid frequency band-pass filter having a level of −3 dB and a center frequency of 1 KHz, a mid-high band-pass filter with a level of −4 dB and a center frequency of 2 KHz, and a high band-pass filter with a level of −4 dB and a center frequency of 4 KHz.

9. The method of claim 1, wherein normalizing the equalized signal yields a normalized equalized signal, and the method further comprises:
    processing the normalized equalized signal with a companding algorithm.

10. The method of claim 9, wherein the companding algorithm is a u-law algorithm.

11. A system comprising:
    a processor; and
    a computer-readable medium storing instructions which, when executed by the processor, cause the processor to perform operations comprising:
        normalizating a received signal to a level of between −2 dB and −10 dB to yield a normalized signal;
        compressing the normalized signal exceeding a threshold set at 70% of the peak volume to yield a compressed signal;
        performing frequency equalization on the compressed signal to yield an equalized signal; and
        normalizing the equalized signal.

12. The system of claim 11, wherein normalizing the equalized signal yields a normalized equalized signal, and wherein the computer-readable medium stores additional instructions which, when executed by the processor, cause the processor to perform operations further comprising processing the normalized equalized signal with a companding algorithm.

13. The system of claim 12, wherein the companding algorithm is a u-law algorithm.

14. A non-transitory computer-readable storage device storing instructions which, when executed by a processor, cause the processor to perform operations comprising:
    normalizating a received signal to a level of between −2 dB and −10 dB to yield a normalized signal;

compressing the normalized signal exceeding a threshold set at 70% of the peak volume to yield a compressed signal;

performing frequency equalization on the compressed signal to yield an equalized signal; and normalizing the equalized signal.

\* \* \* \* \*